United States Patent
Yang et al.

(10) Patent No.: US 12,289,091 B2
(45) Date of Patent: Apr. 29, 2025

(54) PIEZOELECTRIC FILM ACOUSTIC RESONATOR

(71) Applicants: AAC Technologies (Nanjing) Co., Ltd., Nanjing (CN); AAC ACOUSTIC TECHNOLOGIES (SHENZHEN) CO., LTD., Shenzhen (CN)

(72) Inventors: Shuai Yang, Shenzhen (CN); Lirong Zhang, Shenzhen (CN); Ke Wu, Shenzhen (CN); Zhiqiang Zhuang, Shenzhen (CN); Chao Wang, Shenzhen (CN)

(73) Assignees: AAC Technologies (Nanjing) Co., Ltd., Nanjing (CN); AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 792 days.

(21) Appl. No.: 17/566,711

(22) Filed: Dec. 31, 2021

(65) Prior Publication Data

US 2023/0170874 A1    Jun. 1, 2023

(30) Foreign Application Priority Data

Nov. 29, 2021  (CN) .......................... 202122961003.X

(51) Int. Cl.
*H03H 9/02*    (2006.01)
*H03H 9/17*    (2006.01)

(52) U.S. Cl.
CPC ........ *H03H 9/02118* (2013.01); *H03H 9/175* (2013.01)

(58) Field of Classification Search
CPC ..... H03H 9/02118; H03H 9/175; H03H 9/173
See application file for complete search history.

(56) References Cited

U.S. PATENT DOCUMENTS

| | | | |
|---|---|---|---|
| 2017/0117872 A1* | 4/2017 | Morton ................ | G01N 29/022 |
| 2020/0083860 A1* | 3/2020 | Ylilammi ........... | H03H 9/02015 |
| 2020/0274520 A1* | 8/2020 | Shin ........................ | H03H 9/131 |
| 2021/0028754 A1* | 1/2021 | Hurwitz .................. | H01L 24/94 |
| 2021/0050839 A1* | 2/2021 | Pang .................. | H03H 9/02118 |

* cited by examiner

*Primary Examiner* — Bryan P Gordon
(74) *Attorney, Agent, or Firm* — Wiersch Law Group

(57) ABSTRACT

The present invention provides a piezoelectric film acoustic resonator, which comprises a substrate, a first electrode disposed over the substrate, a piezoelectric film disposed over the substrate and covering at least a portion of the first electrode and a second electrode disposed on a surface of the piezoelectric film away from the first electrode, one end of the first electrode extends in the direction away from the piezoelectric film to form a first extended pad, one end of the second electrode extends in the direction away from the first extended pad to form a second extended pad, the first extended pad comprises a first protruding reflection grating on the surface away from the substrate, the second extended pad comprises a second protruding reflection grating on the surface away from the substrate. The configuration can reduce the impact on acoustic performance while improving the quality factor.

20 Claims, 10 Drawing Sheets

PIEZOELECTRIC FILM ACOUSTIC RESONATOR

TECHNICAL FIELD

The present invention relates to the technical field of resonators, in particular to a piezoelectric film acoustic resonator.

BACKGROUND

With the development of wireless communication systems in the direction of miniaturization, high frequency and integration, traditional dielectric filters and surface acoustic wave filters are also difficult to meet the requirements of miniaturization and high frequency. The filter composed of film bulk acoustic wave resonators has the incomparable volume advantages of ceramic dielectric filters, the incomparable operating frequency and power capacity advantages of surface acoustic wave resonators; especially MEMS technology is becoming more and more mature, and film bulk acoustic resonators have become the development trend of today's wireless communication systems.

The quality factor of film bulk acoustic wave resonator, also known as Q value, is an important index to measure the performance of a film bulk wave acoustic resonator. However, on the premise of improving the quality factor of the film bulk acoustic resonator in related technologies, the acoustic performance will be reduced.

SUMMARY

In view of the above, there is a need to provide a piezoelectric film acoustic resonator which can maintain good acoustic performance while improving the quality factor.

A piezoelectric film acoustic resonator is provided, which comprises: a substrate, a first electrode disposed over the substrate, a piezoelectric film disposed over the substrate and covering at least a portion of the first electrode, a second electrode disposed on a surface of the piezoelectric film away from the first electrode, and an acoustic mirror arranged under the first electrode, the projections of the substrate, the acoustic mirror, the first electrode, the piezoelectric film and the second electrode in the thickness direction of the piezoelectric film are at least partially overlapped, a resonance region where the projections of the substrate, the acoustic mirror, the first electrode, the piezoelectric film and the second electrode are overlapped is formed, one end of the first electrode extends in the direction away from the piezoelectric film to form a first extended pad, one end of the second electrode extends in the direction away from the first extended pad to form a second extended pad, wherein, a first protruding reflection grating is disposed on the surface of the first extended pad away from the substrate, a second protruding reflection grating is disposed on the surface of the second extended pad away from the substrate.

As an improvement, there is a space between the first protruding reflection grating and the first electrode, there is a space between the second protruding reflection grating and the second electrode.

As an improvement, the first protruding reflection grating comprises a plurality of first sub protruding strips arranged at intervals on the surface of the first extended pad away from the substrate; the second protruding reflection grating comprises a plurality of second sub protruding strips arranged at intervals on the surface of the second extended pad away from the substrate.

As an improvement, the first sub protruding strip is arranged perpendicular to the extension direction of the first extended pad, and the second sub protruding strip is arranged perpendicular to the extension direction of the second extended pad.

As an improvement, the first sub protruding strip has a first notch, and the second sub protruding strip has a second notch.

As an improvement, the first notch is in the middle of the first sub protruding strip, and the second notch is in the middle of the second sub protruding strip.

As an improvement, the acoustic mirror is a cavity formed by a recess on the surface of the substrate close to the first electrode, and the first electrode covers the cavity.

As an improvement, the acoustic mirror is an acoustic Bragg mirror arranged between the substrate and the first electrode.

As an improvement, the first protruding reflection grating and the second protruding reflection grating comprises a metal material, the metal material comprises at least one of molybdenum, tungsten, gold, ruthenium, iridium and platinum.

As an improvement, the first protruding reflection grating and the second protruding reflection grating comprises a dielectric material, the dielectric material comprises AlN.

With the piezoelectric film acoustic resonator provided above, when the transverse acoustic wave leaks from the resonance region to the first extended pad and the second extended pad, the first protruding reflection grating and the second protruding reflection grating can reflect these leaked transverse acoustic waves back to the resonance region, and effectively reduce these leakage of transverse acoustic waves into the substrate, thereby improving the quality factor of the film bulk acoustic resonator (FBAR). In addition, the first protruding reflection grating and the second protruding reflection grating increase the area of the first extended pad and the second extended pad, thereby reducing the resistance of the first extended pad and the second extended pad. Thus, the present invention can reduce the impact on the acoustic performance on the premise of improving the quality factor.

DESCRIPTION OF EMBODIMENTS

Figure 1:
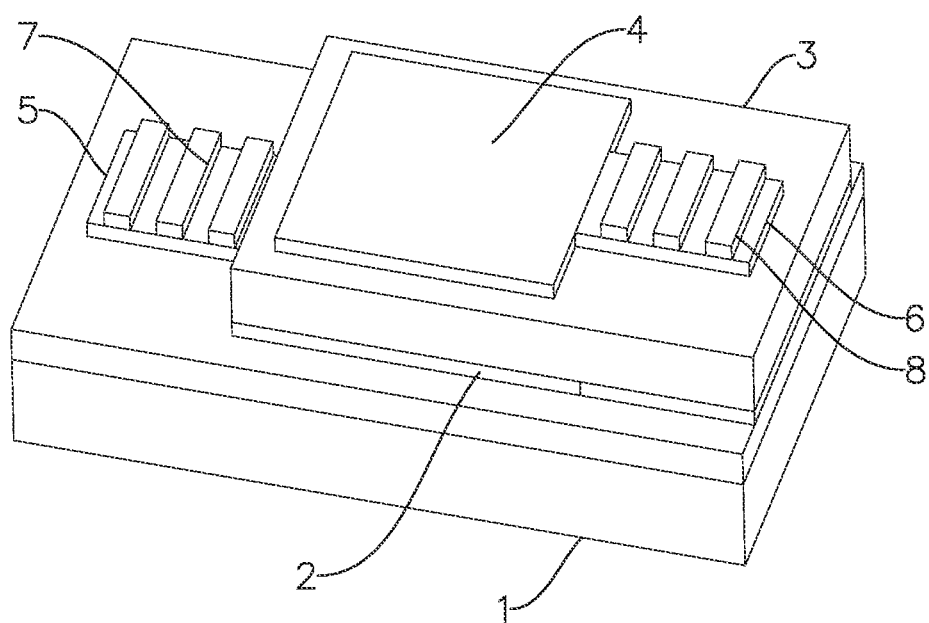
FIG. 1 is a schematic diagram of a piezoelectric film acoustic resonator according to the first embodiment.

The technical solutions in embodiments of the present disclosure will be described clearly and completely below with reference to the accompanying drawings in the embodiments of the present disclosure. It is appreciated that the described embodiments are merely some of rather than all of the embodiments of the present disclosure. All other embodiments acquired by those skilled in the art without creative efforts based on the embodiments of the present disclosure shall fall within the protection scope of the present disclosure.

It is to be noted that all directional indications (such as top, bottom, left, right, front, rear . . . ) in the embodiments of the present disclosure are merely to illustrate a relative position relation, a relative motion condition, etc. between parts in a certain particular state (as shown in the drawings). If the particular state changes, the directional indication changes accordingly.

In addition, the terms such as "first" and "second" in the present disclosure are used for descriptive purposes only, which cannot be construed as indicating or implying a relative importance or implicitly specifying the number of the indicated technical features. Thus, the features defined with "first" and "second" may explicitly or implicitly include at least one of the features. In addition, technical solutions of the embodiments of the present disclosure may be combined with each other. However, this must be based on the fact that those of ordinary skill in the art can implement the combination. When the combination of the technical solutions is contradictory or cannot be implemented, it should be considered that the combination of the technical solutions does not exist and does not fall within the protection scope claimed in the present disclosure.

Figure 2:
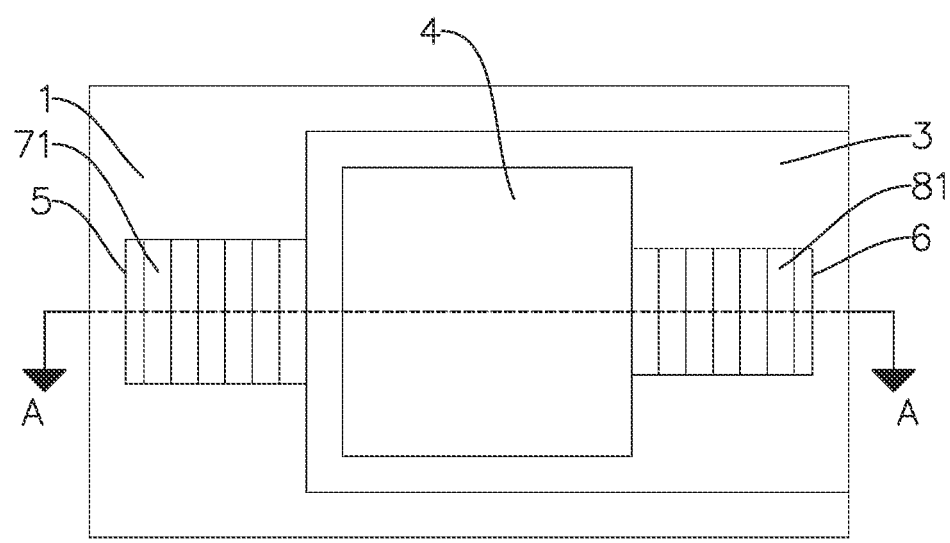
FIG. 2 is a top view of a piezoelectric film acoustic resonator according to the first embodiment.
Figure 3:
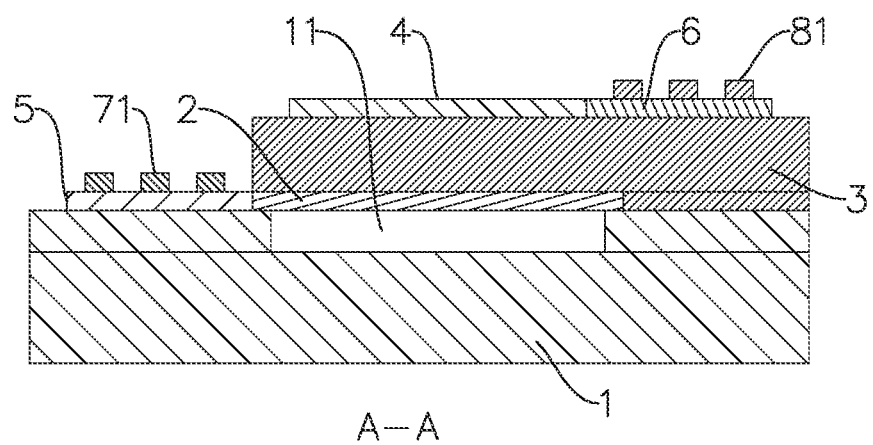
FIG. 3 is a sectional view of the piezoelectric film acoustic resonator taken along line A-A in FIG. 2.
Figure 4:
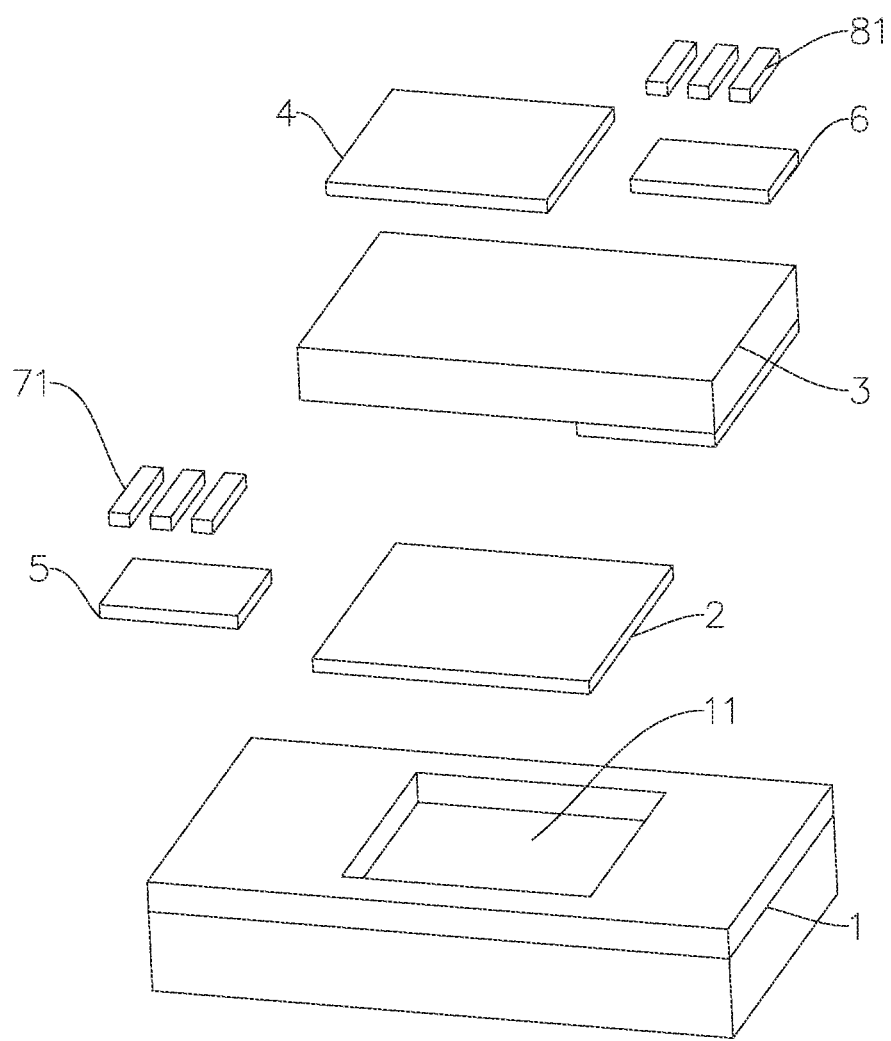
FIG. 4 is an exploded view of a piezoelectric film acoustic resonator according to the first embodiment.

Referring to FIGS. 1-4, an embodiment of the present invention provides a piezoelectric film acoustic resonator 3, which comprises a substrate 1, a first electrode 2 disposed over the substrate 1, a piezoelectric film 3 disposed over the substrate 1 and covering at least a portion of the first electrode 2, an acoustic mirror 11 arranged under the first electrode 2 and a second electrode 4 disposed on a surface of the piezoelectric film 3 away from the first electrode 2. The acoustic mirror 11 in the embodiment is a cavity. The projections of the substrate 1, the acoustic mirror 11, the first electrode 2, the piezoelectric film 3 and the second electrode 4 in the thickness direction of the piezoelectric film 3 are at least partially overlapped, a resonance region where the projections of the substrate 1, the acoustic mirror 11, the first electrode 2, the piezoelectric film 3 and the second electrode 4 are overlapped is formed.

One end of the first electrode 2 extends in the direction away from the piezoelectric film 3 along the surface where the substrate 1 is connected to the first electrode 2 to form the first extended pad 5. One end of the second electrode 4 extends in the direction away from the first extended pad 5 to form a second extended pad 6, the first extended pad 5 comprises a first protruding reflection grating 7 on the surface away from the substrate 1, the second extended pad 6 comprises a second protruding reflection grating 8 on the surface away from the substrate 1.

The piezoelectric film 3 of the present invention can comprises a piezoelectric material, the piezoelectric material can be one of aluminum nitride (AlN), zinc oxide (ZnO), Pbbased Lanthanumdoped Zirconate Titanates (PZT), lithium niobate (LiNbO3) and lithium tantalate (LiTaO3), or a composite piezoelectric material composed of them. The first electrode 2 and the second electrode 4 can comprises one of aluminum (Al), molybdenum (Mo), tungsten (W), ruthenium (Ir) and platinum (Pt) or their composite metals. When the transverse acoustic wave leaks from the resonance region to the first extended pad 5 and the in second extended pad 6, the first protruding reflection grating 7 and the second protruding reflection grating 8 can reflect these leaked transverse acoustic waves back to the resonance region, and effectively reduce the leakage of transverse acoustic waves entering into the substrate 1, thereby improving the quality factor of the film bulk acoustic resonator (FBAR). In addition, the first protruding reflection grating 7 and the second protruding reflection grating 8 increase the area of the first extended pad 5 and the second extended pad 6, thereby reducing the resistance of the first extended pad 5 and the second extended pad 6. Thus, the present invention can reduce the impact on the acoustic performance on the premise of improving the quality factor.

It should be noted that, the first protruding reflection grating 7 and the second protruding reflection grating 8 are respectively disposed on the first extended pad 5 and the second extended pad 6, therefore, parasitic capacitance will not be formed between the first protruding reflection grating 7 and the second electrode 4, and parasitic capacitance will not be formed between the second protruding reflection grating 8 and the first electrode 2. Thus, on the basis of maintaining the improvement of the quality factor, the effective electromechanical coupling coefficient of the piezoelectric film acoustic resonator 3 will not decrease, and the peak intensity of the parasitic resonance in the frequency band f<fs will not increase. In addition, the first protruding reflection grating 7 and the second protruding reflection grating 8 have the same manufacturing process of the protruding frame used in the structure in the related art, without additional process steps.

Figure 5:
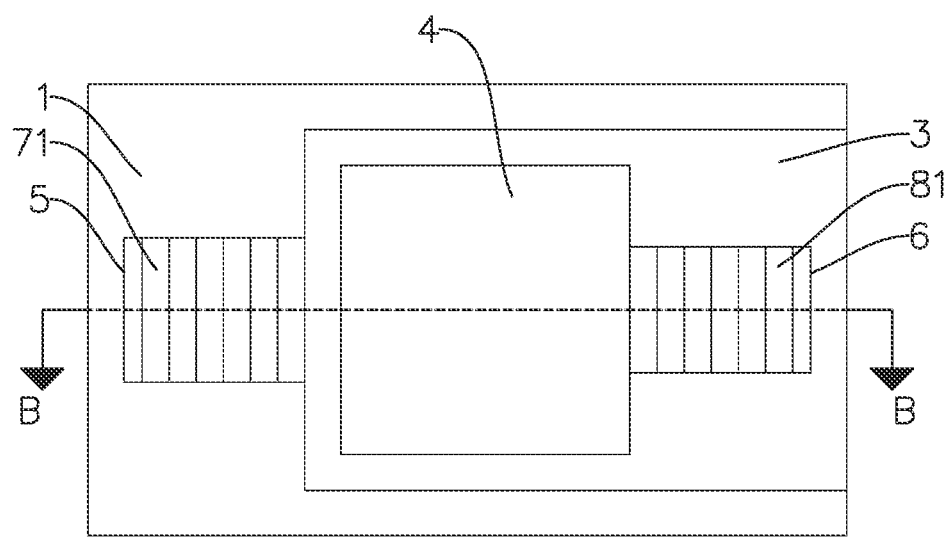
FIG. 5 is a top view of a piezoelectric film acoustic resonator according to the second embodiment.
Figure 6:
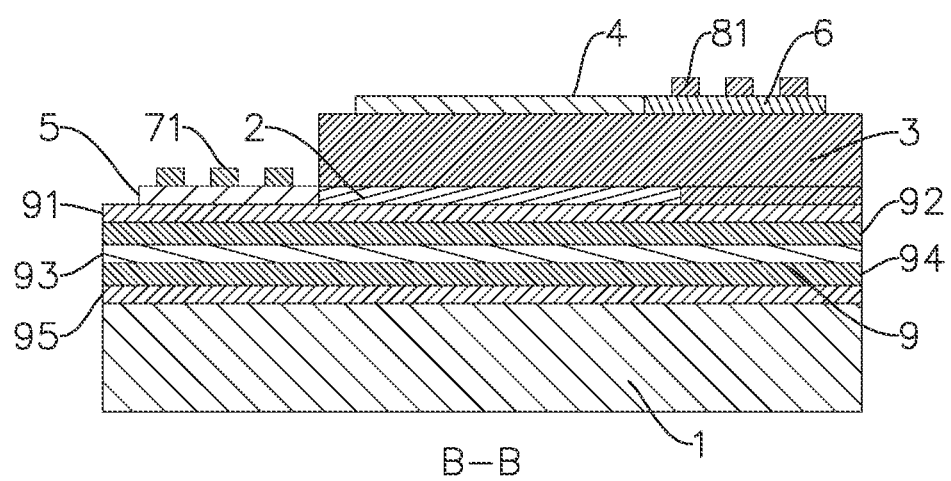
FIG. 6 is a sectional view of the piezoelectric film acoustic resonator taken along line B-B in FIG. 5.
Figure 7:
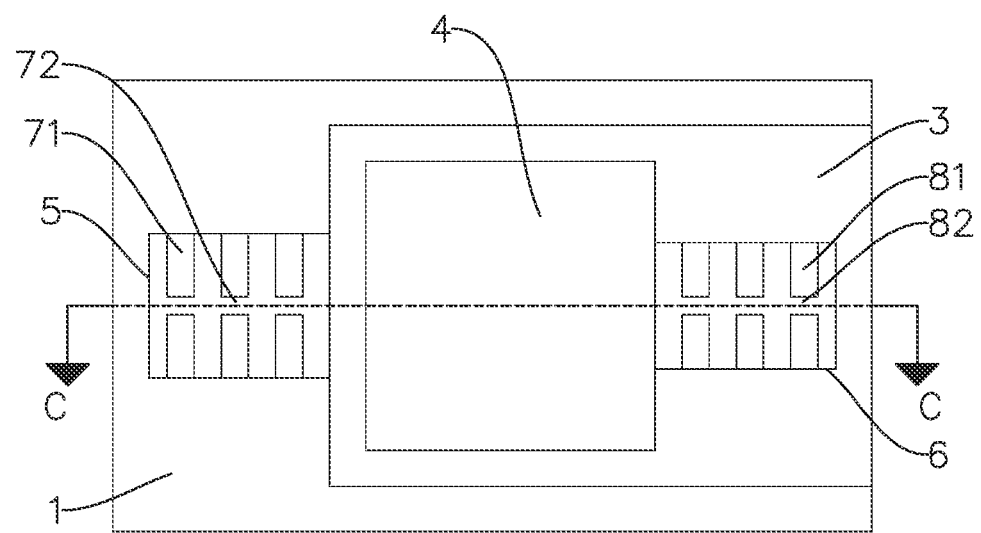
FIG. 7 is a top view of a piezoelectric film acoustic resonator according to the third embodiment.
Figure 8:
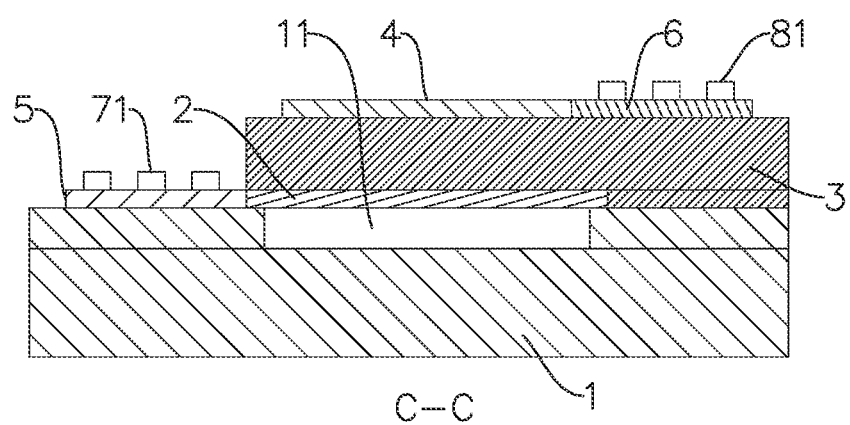
FIG. 8 is a sectional view of the piezoelectric film acoustic resonator taken along line C-C in FIG. 7.
Figure 9:
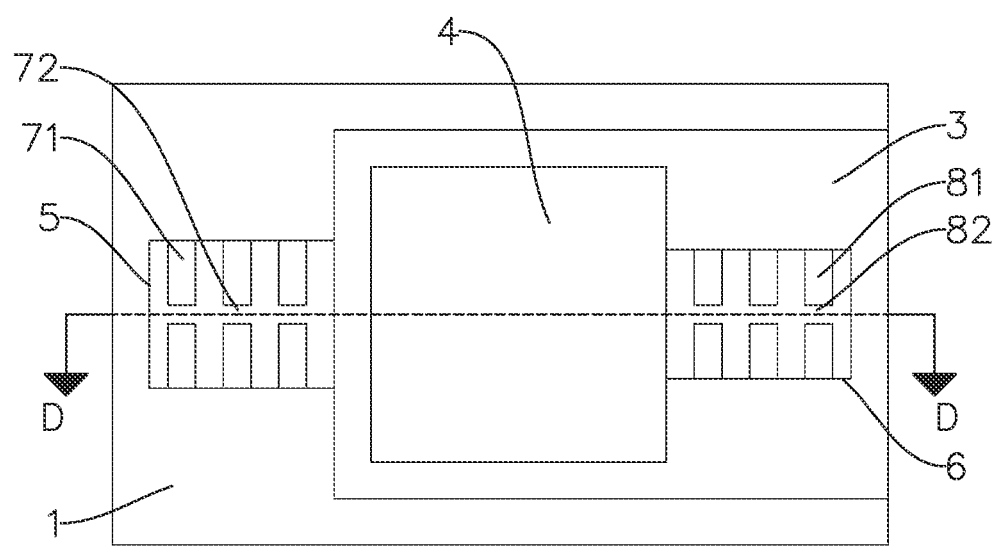
FIG. 9 is a top view of a piezoelectric film acoustic resonator according to the fourth embodiment.
Figure 10:
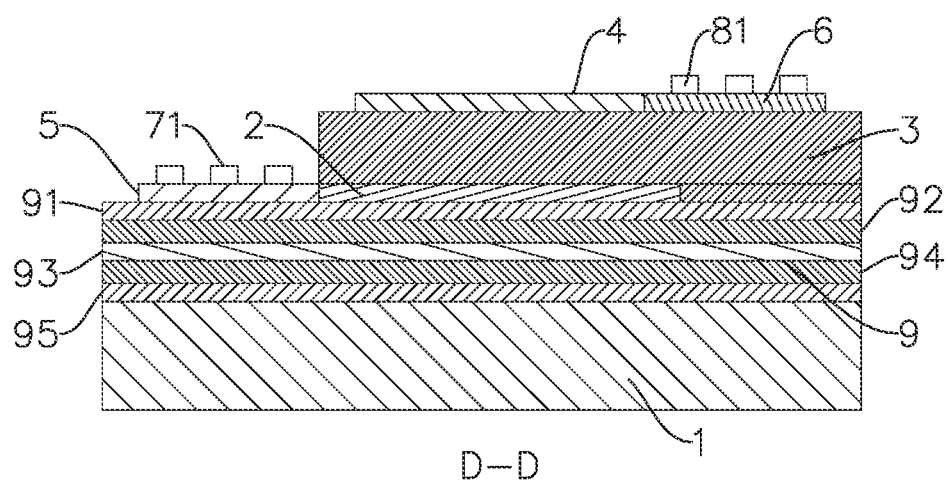
FIG. 10 is a sectional view of the piezoelectric film acoustic resonator taken along line D-D in FIG. 9.

Preferably, referring to FIGS. 1-10, there is a space between the first protruding reflection grating 7 and the first electrode 2, there is a space between the second protruding reflection grating 8 and the second electrode 4. The first protruding reflection grating 7 comprises a plurality of first sub protruding strips 71 arranged at intervals on the surface of the first extended pad 5 away from the substrate 1; the second protruding reflection grating 8 comprises a plurality of second sub protruding strips 81 arranged at intervals on the surface of the second extended pad 6 away from the substrate 1. The first sub protruding strip 71 is arranged perpendicular to the extension direction of the first extended pad 5, and the second sub protruding strip 81 is arranged perpendicular to the extension direction of the second extended pad 5. The first sub protruding strip 71 has a first notch 72, and the second sub protruding strip 81 has a second notch 82, the first notch 72 is in the middle of the first sub protruding strip 71, and the second notch 82 is in the middle of the second sub protruding strip 81.

In this embodiment, the second protruding reflection grating 8 is disposed on the second electrode 4, thus avoiding a parasitic capacitance between the second protruding reflection grating 8 and the first electrode 2. The first protruding reflection grating 7 is disposed on the first electrode 2, thus avoiding a parasitic capacitance between first protruding reflection grating 7 and the second electrode 4. Therefore, it is avoided that the bandwidth of the filter composed of the piezoelectric film acoustic resonator 3 is reduced and the ripple in the passband becomes larger. Through the arrangement of the structure and position of the first protruding reflection grating 7 and the second protruding reflection grating 8, the quality factor can be improved without increasing the process steps. It should be noted that the first sub protruding strip 71 is not limited to be perpendicular to the extension direction of the first extended pad 5, and the second sub protruding strip 81 is not limited to be perpendicular to the extension direction of the second extended pad 6. In other embodiments, the extension direction of the first sub protruding strip 71 and the extension direction of the first extended pad 5 have an included angle less than 90 degree, the extension direction of the second sub protruding strip 81 and the extension direction of the second extended pad 6 have an included angle less than 90 degree. For example, the included angle is set as 45 degree or 30 degree. The first notch 72 can be set not only in the middle of the first sub protruding strip 71, but also in any position of the first sub protruding strip 71, and the position of the first notch 72 on each first sub protruding strip 71 can be the same or different. In the same way, the second notch 82 is also provided at any position of the second sub protruding strip 81, and the position of the second notch 82 on each second sub protruding strip 81 can be the same or different. The shape of the first sub protruding strip 71 and the second sub protruding strip 81 can be arc, broken line or wave shape, etc. When the shape is arc, the first sub protruding strips 71 can be arranged at equal intervals around the center point of the first electrode 2, and the second sub protruding strips 81 can be arranged at equal intervals around the center point of the second electrode 4. When the shape is a broken line or a wave shape, the first sub protruding strip 71 can be arranged perpendicular to the extension direction of the first extended pad 5, and the second sub protruding strip 81 can be arranged perpendicular to the extension direction of the second extended pad 6. Of course, the space between the adjacent first sub protruding strips 71 or between the adjacent second sub protruding strip 81 can be equal or unequal. It should be noted that the length, height, and width of each first sub protruding strip 71 is preferably equal; of course, they may not be equal if required. In the same way, the length, height, and width of each second sub protruding strip 81 is preferably equal; and they may not be equal if required.

Preferably, referring to FIGS. 3-4 and 7-8, the acoustic mirror 11 is a cavity 11 formed by a recess on the surface of the substrate 1 close to the first electrode 2, and the first electrode 2 covers the cavity 11.

In this embodiment, the substrate 1 has a cavity 11, and the first electrode 2 covers the cavity 11. The structure can weaken the acoustic waves entering the substrate 1, and to a certain degree, effectively reduce the leakage of acoustic waves entering into the substrate 1, thereby improving the quality factor of the film bulk acoustic resonator (FBAR).

Preferably, referring FIGS. 5-6 and 9-10, an acoustic Bragg mirror 9 is arranged between the substrate 1 and the first electrode 2. The acoustic Bragg mirror 9 also can function as an acoustic mirror.

In this embodiment, a first acoustic impedance material layer and a second acoustic impedance material layer are alternately stacked to form the acoustic Bragg mirror 9. The acoustic impedance of the first acoustic impedance material layer is less than that of the second acoustic impedance material layer. And, the first acoustic impedance material layer is disposed on the side near the first electrode 2. The acoustic Bragg mirror 9 effectively reduce the leakage of transverse acoustic waves entering into the substrate 1, thereby improving the quality factor of the film bulk acoustic resonator (FBAR). It should be noted that the acoustic Bragg mirror 9 should be composed of at least two kinds of layers of different acoustic impedance stacked alternately. For example, the acoustic Bragg mirror 9 is formed of five kinds layers of different materials, which are the first material layer 91, the second material layer 92, the third material layer 93, the fourth material layer 94 and the fifth material layer 95. The five kinds of layers are stacked in turn. The acoustic impedance of the materials of the first material layer 91 near the first electrode 2, the fifth material layer 95 near the substrate 1 and the third material layer 93 are relatively lower, while the acoustic impedance of the materials of the second material layer 92 and the fourth material layer 94 are relatively higher.

Preferably, both the first protruding reflection grating 7 and the second protruding reflection grating 8 comprises a metal material, the metal material comprises at least one of molybdenum, tungsten, gold, ruthenium, iridium and platinum.

In this embodiment, the metal material can be one of molybdenum (Mo), tungsten (W), gold (Au), ruthenium (Ru), iridium (Ir) and platinum (Pt) or a composite metal composed of them. The acoustic impedance of the material of the first protruding reflection grating 7 and second protruding reflection grating 8 are high, so as to realize that the area contains the first protruding reflection grating 7 and the second protruding reflection grating 8 and the area does not contain the first protruding reflection grating 7 and the second protruding reflection grating 8 have a large difference in acoustic impedance. So the transverse acoustic waves propagating outside the resonance region are reflected back to the resonance region, and the energy carried by these transverse acoustic waves is limited in the resonance region, and the quality factor is improved.

Preferably, both the first protruding reflection grating 7 and the second protruding reflection grating 8 comprises a dielectric material, the dielectric material comprises AlN.

In this embodiment, the electrical materials can be AlN and so on. The acoustic impedance of the material of the first protruding reflection grating 7 and second protruding reflection grating 8 are high, so as to realize that the area contains the first protruding reflection grating 7 and the second protruding reflection grating 8 and the area does not contain the first protruding reflection grating 7 and the second protruding reflection grating 8 have a large difference in acoustic impedance. And so the transverse acoustic waves propagating outside the resonance region are reflected back to the resonance region, so that the energy carried by these transverse acoustic waves is limited in the resonance region, and the quality factor is improved.

In conclusion, the piezoelectric film acoustic resonator provided by the present invention improve the quality factor without increasing the process steps, decreasing the effective electromechanical coupling coefficient and increasing the parasitic resonance peak intensity in the frequency band $f<fs$, which improves the acoustic performance of the resonator.

The above are only embodiments of the present disclosure. It should be pointed out that those of ordinary skill in the art may also make improvements without departing from the ideas of the present disclosure, all of which fall within the protection scope of the present disclosure.

What is claimed is:
1. A piezoelectric film acoustic resonator, comprising:
   a substrate,
   a first electrode disposed over the substrate,
   a piezoelectric film disposed over the substrate and covering at least a portion of the first electrode, a second electrode disposed on a surface of the piezoelectric film away from the first electrode, and an acoustic mirror arranged under the first electrode, the projections of the substrate, the acoustic mirror, the first electrode, the piezoelectric film and the second electrode in the thickness direction of the piezoelectric film are at least partially overlapped, a resonance region where the projections of the substrate, the acoustic mirror, the first electrode, the piezoelectric film and the second electrode are overlapped is formed, one end of the first electrode extends in the direction away from the piezoelectric film to form a first extended pad, one end of the second electrode extends in the direction away from the first extended pad to form a second extended pad, wherein, a first protruding reflection grating is disposed on the surface of the first extended pad away from the substrate, a second protruding reflection grating is disposed on the surface of the second extended pad away from the substrate.

2. The piezoelectric film acoustic resonator according to claim 1, wherein there is a space between the first protruding reflection grating and the first electrode, there is a space between the second protruding reflection grating and the second electrode.

3. The piezoelectric film acoustic resonator according to claim 1, wherein the first protruding reflection grating comprises a plurality of first sub protruding strips arranged at intervals on the surface of the first extended pad away from the substrate; the second protruding reflection grating comprises a plurality of second sub protruding strips arranged at intervals on the surface of the second extended pad away from the substrate.

4. The piezoelectric film acoustic resonator according to claim 3, wherein the first sub protruding strip is arranged perpendicular to the extension direction of the first extended pad, and the second sub protruding strip is arranged perpendicular to the extension direction of the second extended pad.

5. The piezoelectric film acoustic resonator according to claim 3, wherein the first sub protruding strip has a first notch, and the second sub protruding strip has a second notch.

6. The piezoelectric film acoustic resonator according to claim 5, wherein the first notch is in the middle of the first sub protruding strip, and the second notch is in the middle of the second sub protruding strip.

7. The piezoelectric film acoustic resonator according to claim 1, wherein the acoustic mirror is a cavity formed by a recess on the surface of the substrate close to the first electrode, and the first electrode covers the cavity.

8. The piezoelectric film acoustic resonator according to claim 1, wherein the acoustic mirror is an acoustic Bragg mirror arranged between the substrate and the first electrode.

9. The piezoelectric film acoustic resonator according to claim 1, wherein the first protruding reflection grating and the second protruding reflection grating comprises a metal material, the metal material comprises at least one of molybdenum, tungsten, gold, ruthenium, iridium and platinum.

10. The piezoelectric film acoustic resonator according to claim 2, wherein the first protruding reflection grating and the second protruding reflection grating comprises a metal material, the metal material comprises at least one of molybdenum, tungsten, gold, ruthenium, iridium and platinum.

11. The piezoelectric film acoustic resonator according to claim 3, wherein the first protruding reflection grating and the second protruding reflection grating comprises a metal material, the metal material comprises at least one of molybdenum, tungsten, gold, ruthenium, iridium and platinum.

12. The piezoelectric film acoustic resonator according to claim 4, wherein the first protruding reflection grating and the second protruding reflection grating comprises a metal material, the metal material comprises at least one of molybdenum, tungsten, gold, ruthenium, iridium and platinum.

13. The piezoelectric film acoustic resonator according to claim 5, wherein the first protruding reflection grating and the second protruding reflection grating comprises a metal material, the metal material comprises at least one of molybdenum, tungsten, gold, ruthenium, iridium and platinum.

14. The piezoelectric film acoustic resonator according to claim 6, wherein the first protruding reflection grating and the second protruding reflection grating comprises a metal material, the metal material comprises at least one of molybdenum, tungsten, gold, ruthenium, iridium and platinum.

15. The piezoelectric film acoustic resonator according to claim 1, wherein the first protruding reflection grating and the second protruding reflection grating comprises a dielectric material, the dielectric material comprises AlN.

16. The piezoelectric film acoustic resonator according to claim 2, wherein the first protruding reflection grating and the second protruding reflection grating comprises a dielectric material, the dielectric material comprises AlN.

17. The piezoelectric film acoustic resonator according to claim 3, wherein the first protruding reflection grating and the second protruding reflection grating comprises a dielectric material, the dielectric material comprises AlN.

18. The piezoelectric film acoustic resonator according to claim 4, wherein the first protruding reflection grating and the second protruding reflection grating comprises a dielectric material, the dielectric material comprises AlN.

19. The piezoelectric film acoustic resonator according to claim 5, wherein the first protruding reflection grating and the second protruding reflection grating comprises a dielectric material, the dielectric material comprises AlN.

20. The piezoelectric film acoustic resonator according to claim 6, wherein the first protruding reflection grating and the second protruding reflection grating comprises a dielectric material, the dielectric material comprises AlN.

* * * * *